United States Patent
Yoon

(10) Patent No.: US 8,520,442 B2
(45) Date of Patent: Aug. 27, 2013

(54) METHOD OF OPERATING SEMICONDUCTOR MEMORY DEVICE

(71) Applicant: SK hynix Inc., Icheon-si (KR)

(72) Inventor: Mi Sun Yoon, Gunsan-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/769,537

(22) Filed: Feb. 18, 2013

(65) Prior Publication Data

US 2013/0155775 A1    Jun. 20, 2013

Related U.S. Application Data

(62) Division of application No. 12/982,529, filed on Dec. 30, 2010, now Pat. No. 8,395,944.

(30) Foreign Application Priority Data

Dec. 31, 2009  (KR) ........................ 10-2009-0135639

(51) Int. Cl.
*G11C 16/10*   (2006.01)
*G11C 16/26*   (2006.01)

(52) U.S. Cl.
USPC ............. 365/185.22; 365/185.18; 365/189.05

(58) Field of Classification Search
USPC ........................... 365/185.22, 185.18, 189.05
See application file for complete search history.

(56) References Cited

U.S. PATENT DOCUMENTS

| | | | | |
|---|---|---|---|---|
| 8,059,460 | B2 * | 11/2011 | Jeong et al. | 365/185.09 |
| 2009/0290421 | A1 * | 11/2009 | Park et al. | 365/185.18 |
| 2010/0080059 | A1 * | 4/2010 | Chen | 365/185.12 |
| 2010/0284227 | A1 * | 11/2010 | Choi et al. | 365/185.22 |

* cited by examiner

*Primary Examiner* — Toan Le
*Assistant Examiner* — Hai Pham
(74) *Attorney, Agent, or Firm* — William Park & Associates Patent Ltd.

(57) ABSTRACT

A semiconductor memory device is operated by reading data stored in LSB and MSB pages of a first word line in response to a read command and storing the read data in first and second latches of a page buffer, outputting the data stored in the first latch externally and transferring the data, stored in the second latch, to a third latch of the page buffer, resetting the first and second latches, reading data stored in LSB and MSB pages of a second word line, and storing the read data in the first and second latches, and sequentially outputting the data stored in the first latch and the data stored in the third latch, resetting the third latch, and then transferring the data stored in the second latch to the third latch.

6 Claims, 8 Drawing Sheets

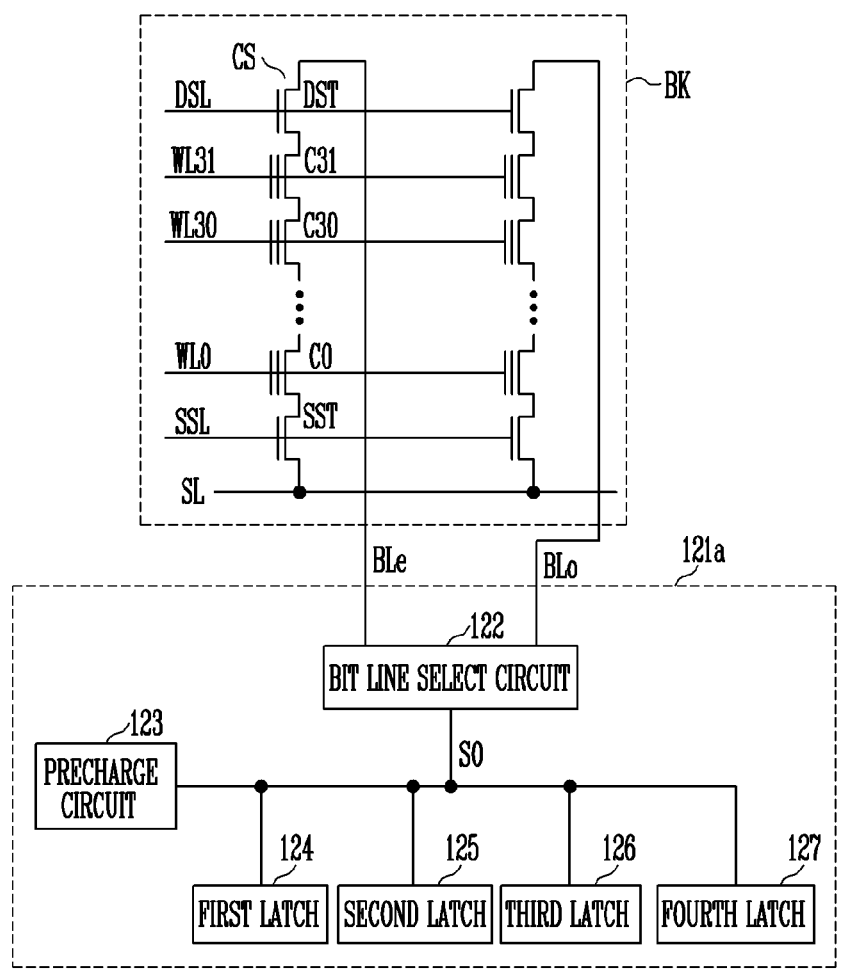

FIG. 4

| DATA OUTPUT SEQUENCE | READ DATA (SECOND AND THIRD LATCHES) | TEMPORARY LATCH (FOURTH LATCH) |
|---|---|---|
| Output 0th data<br>Temporarily store second data | 0th data<br>Second data | Temporarily store second data |
| Output first data<br>Output second data<br>Temporarily store fourth data | First data<br>Fourth data | Temporarily store fourth data |
| Output third data<br>Output fourth data<br>Temporarily store sixth data | Third data<br>Sixth data | Temporarily store sixth data |
| Output fifth data<br>Output sixth data<br>Temporarily store eighth data | Fifth data<br>Eighth data | Temporarily store eighth data |
| Output seventh data<br>Output eighth data<br>Temporarily store tenth data | Seventh data<br>Tenth data | Temporarily store tenth data |

FIG. 5A

| PROGRAM SEQUENCE | INPUTTED DATA | TEMPORARY LATCH (FOURTH LATCH) |
|---|---|---|
| Program WL0, LSB page | 0th data | |
| Standby state | First data | Temporarily store first data |
| Program WL1, LSB page (second data) Program WL0, MSB page (first data) | Second data | Temporarily store first data |
| Standby state | Third data | Temporarily store third data |
| Program WL2, LSB page (fourth data) Program WL1, MSB page (third data) | Fourth data | Temporarily store third data |

METHOD OF OPERATING SEMICONDUCTOR MEMORY DEVICE

CROSS-REFERENCE TO RELATED APPLICATION

Priority to Korean patent application number 10-2009-0135639 filed on Dec. 31, 2009, the entire disclosure of which is incorporated by reference herein, is claimed.

BACKGROUND

Exemplary embodiments relate to a method of operating a semiconductor memory device.

A NAND flash memory device, which is nonvolatile, includes a memory cell array, a row decoder, and a page buffer. The memory cell array includes a plurality of word lines elongated in rows, a plurality of bit lines elongated in columns, and a plurality of cell strings corresponding to the respective bit lines.

The functions of the semiconductor memory devices are gradually improved through high degree of integration and increase in the capacity while reducing the chip size.

In order to further advance high integration of semiconductor memory devices, a multi-bit cell design is studied for storing more than one data in a single memory cell. This type of the memory cell is called a multi-level cell (MLC). A memory cell capable of storing one bit is called a single level cell (SLC).

The multi-level cell utilizes a plurality of threshold voltages with an increase in the number of bits that can be stored. With high integration, a narrower gap exists between memory cells.

Accordingly, while a program operation is performed in a semiconductor memory device, the threshold voltages of memory cells can be shifted due to a coupling effect caused by the threshold voltages of neighboring memory cells.

BRIEF SUMMARY

Exemplary embodiments relate to a method of operating a semiconductor memory device, wherein in a structure in which a page buffer is coupled to each bit line, data can be sequentially read when a least significant bit (LSB) program and a most significant bit (MSB) program are performed at the same time, by changing the sequence in which page addresses are selected for the programs and the sequence in which data is read.

A method of operating a semiconductor memory device according to an aspect of the present disclosure includes a first read step of reading data stored in LSB and MSB pages of a first word line in response to a read command and storing the read data in first and second latches of a page buffer, respectively, a step of outputting the data stored in the first latch externally and transferring the data, stored in the second latch, to a third latch of the page buffer, a second read step of resetting the first and second latches, reading data stored in LSB and MSB pages of a second word line, and storing the read data in the first and second latches, respectively, and a step of sequentially outputting the data stored in the first latch and the data stored in the third latch, resetting the third latch, and then transferring the data stored in the second latch to the third latch.

The method further includes the step of performing a program operation, before the first read is performed. The program operation is performed by inputting a first program command and first data to be programmed, programming the first data into the LSB page of the first word line, inputting a second program command and second data to be programmed, programming the second data into the LSB page of the second word line, inputting a third program command and third data to be programmed, and programming the third data into the MSB page of the first word line.

A method of operating a semiconductor memory device according to another aspect of the present disclosure includes inputting a first program command and first data to be programmed, selecting an LSB page of a first word line, programming the first data into the LSB page, and verifying the program for the LSB page, inputting a second program command and second data to be programmed, storing the second data in a temporary latch of a page buffer, inputting a third program command and third data to be programmed, programming the third data into a LSB page of a second word line and verifying the program for the LSB page of the second word line, and programming the second data of the latch into an MSB page of the first word line and verifying the program for the MSB page.

BRIEF DESCRIPTION OF THE DRAWINGS

FIG. 1B is a detailed diagram showing a memory block and a page buffer shown in FIG. 1A;

FIG. 4 is a table showing the sequence in which data is outputted when a program operation of the semiconductor memory device is performed according to an embodiment of this disclosure;

FIG. 5A is a table showing the sequence in which data is programmed when the program operation of the semiconductor memory device according to an embodiment of this disclosure is performed.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1A:
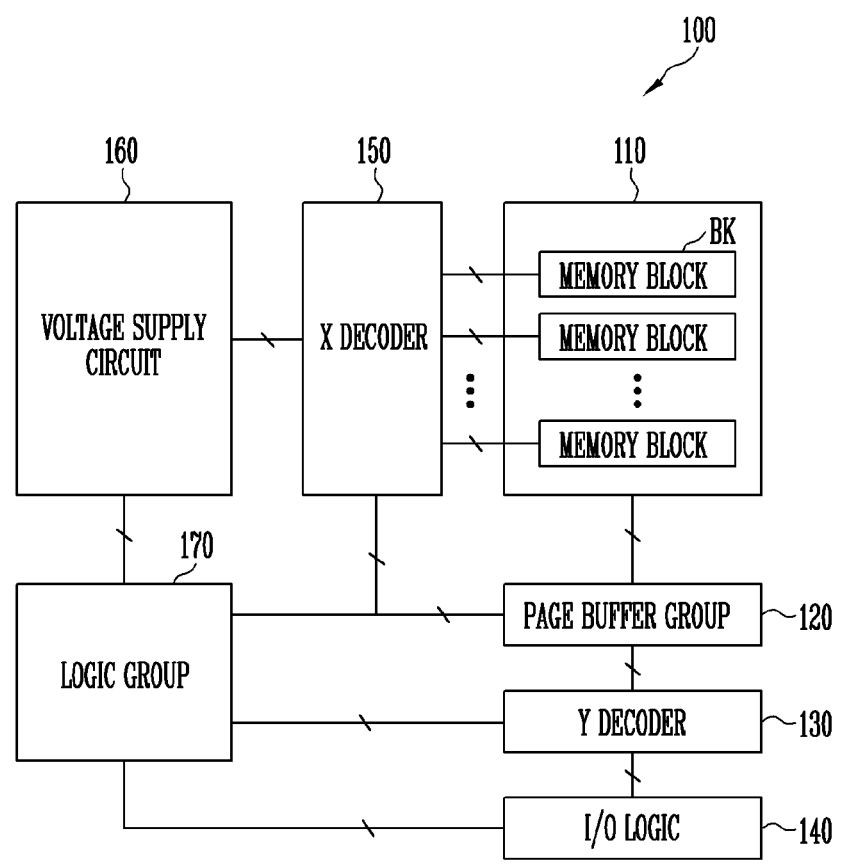
FIG. 1A is a block diagram of a semiconductor memory device according to an embodiment of this disclosure.

FIG. 1A is a block diagram of a semiconductor memory device according to an embodiment of the present invention.

Referring to FIG. 1A, the semiconductor memory device 100 includes a memory cell array 110, a page buffer group 120, a Y decoder 130, an I/O logic 140, an X decoder 150, a voltage supply circuit 160, and a logic group 170.

The memory cell array 110 includes a plurality of memory blocks BK.

Each of the memory blocks BK (now referring to FIGS. 1B-1C) includes a plurality of cell strings CS. Each of the cell strings CS includes a plurality of memory cells coupled in series.

The cell strings CS are coupled to respective bit lines.

It is assumed that each of the memory cells is a multi-level cell (MLC) capable of storing data of 2 or more bits.

The page buffer group 120 (now back to FIG. 1A) includes page buffers coupled to the bit lines of the memory cell array 110.

The page buffer is configured to temporarily stores data to be programmed into the memory cells and driven when a program operation is performed. The page buffer is driven when a read operation is performed and configured to read data programmed into the memory cells and temporarily store the read data.

The Y decoder 130 provides an I/O path between the page buffers of the page buffer group 120 and the I/O logic 140 in response to a control signal.

The I/O logic 140 performs data I/O between external systems (not shown) to which the semiconductor memory device 100 is applied.

The X decoder 150 enables one of the memory blocks BK of the memory cell array 110 in response to a control signal generated by the logic group 170.

Operating voltages generated by the voltage supply circuit 160 are supplied to the memory block BK enabled by the X decoder 150.

The voltage supply circuit 160 generates the operating voltages in response to a control signal generated by the logic group 170. The operating voltage may include a program voltage, a read voltage, a verification voltage, and an erase voltage.

The logic group 170 generates the control signals for operating the operations of the page buffer group 120, the Y decoder 130, the I/O logic 140, the X decoder 150, and the voltage supply circuit 160 in response to an operation command inputted via the I/O logic 140.

The memory block BK and a connection between the page buffers of the page buffer group 120 are described in more detail below.

FIG. 1B is a detailed diagram showing the memory block and the page buffer of FIG. 1A.

FIG. 1B is a detailed diagram showing one of the plurality of memory blocks BK and a page buffer 121a of the page buffer group 120 shown in FIG. 1A. In particular, in this drawing, the bit line BL is divided into an even bit line BLe and an odd bit line BLo, and the page buffer 121a is coupled to a pair of the even bit line BLe and the odd bit line BLo.

Each of the cell strings CS included in the memory block BK includes $0^{th}$ to thirty-first memory cells C0 to C31 coupled in series a drain select transistor DST and a source select transistor SST.

The drain terminals of the drain select transistors DST of the cell strings CS are coupled to the respective bit lines.

The source terminals of the source select transistors SST of the cell strings CS are coupled to a common source line SL.

The gate terminals of the drain select transistors DST of the cell strings CS are coupled to a drain select line DSL.

The gate terminals of the source select transistors SST of the cell strings CS are coupled to a source select line SSL.

Zeroth ($0^{th}$) to thirty-first (31st) word lines WL0 to WL31 are coupled to the zeroth ($0^{th}$) to thirty-first (31st) memory cells C0 to C31, respectively.

The page buffer 121a coupled to the pair of an even bit line BLe and an odd bit line BLo includes a bit line select circuit 122, a precharge circuit 123, and first to fourth latches 124 to 127.

The bit line select circuit 122 selects the even bit line BLe or the odd bit line BLo in response to the control signal of the logic group 170 and couples a selected bit lint to a sense node SO.

The precharge circuit 123 precharges the sense node SO in response to the control signal of the logic group 170.

The first to fourth latches 124 to 127 temporarily store data to be programmed into the memory cells or store data read from the memory cells when a read operation is performed.

The memory cells of the semiconductor memory device 100 are multi-level cells (MLCs), each capable of storing data of 2 bits, as described above.

The unit selected at the same time when data is programmed or read in the semiconductor memory device 100 is called a page.

Meanwhile, the bit lines and the page buffer may be coupled, unlike in the structure of FIG. 1B.

Figure 1C:
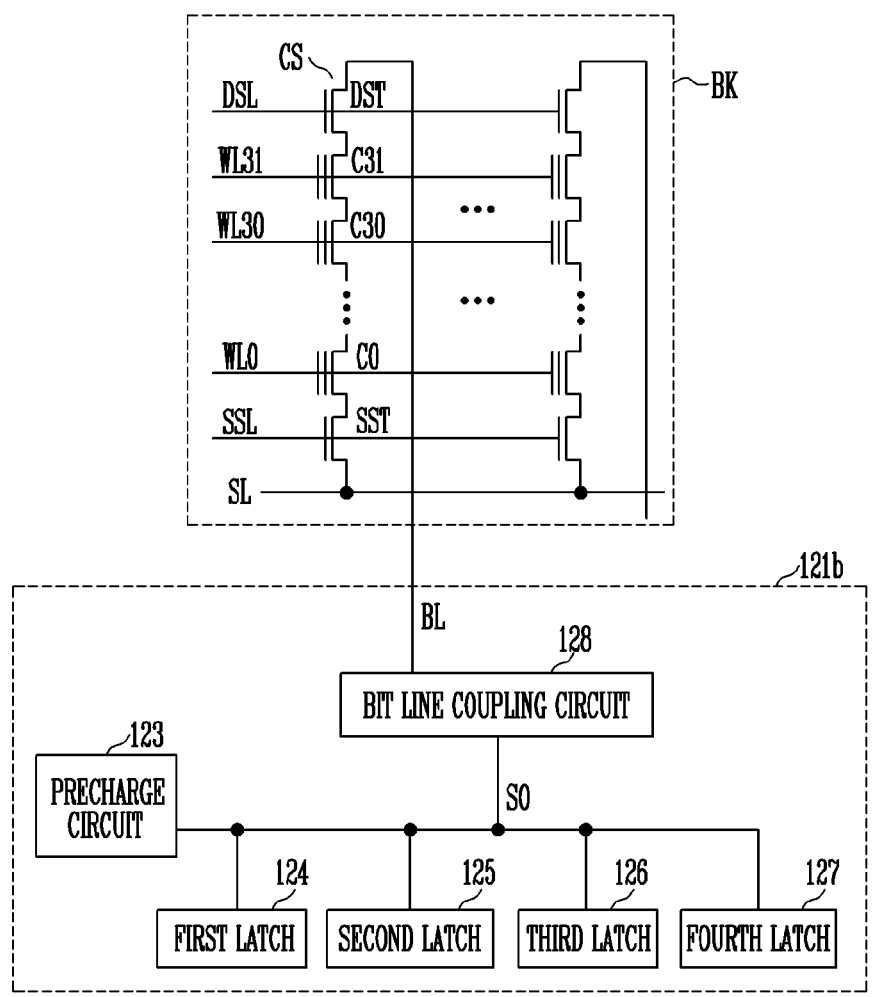
FIG. 1C is a diagram showing another example of the memory block and the page buffer of FIG. 1A.

FIG. 1C is a diagram showing another example of the memory block and the page buffer of FIG. 1A.

The structure of the memory block BK and the page buffer 121, shown in FIG. 1C, is different from the structure of FIG. 1B. In this structure, the page buffer 121b is coupled to each bit line BL.

In FIG. 1C, the memory block BK has the same structure as that of FIG. 1B.

The page buffer 121b includes a bit line coupling circuit 128, a precharge circuit 123, and first to fourth latches 124 to 127.

The precharge circuit 123 and the first to fourth latches 124 to 127 are the same as those of FIG. 1B.

The bit line coupling circuit 128 couples the bit line BL and a sense node SO in response to the control signal of the logic group 170.

In FIG. 1B or 1C, the number of latches included in the page buffer 121a or 121b (that is, the first to fourth latches 124 to 127) may be increased or decreased according to a program operation and a read operation.

In a multi-level cell capable of storing data of 2 bits, the 2 bits are represented by an MSB and an LSB. One word line includes two logical pages (that is, an LSB page and an MSB page).

Figure 2A:
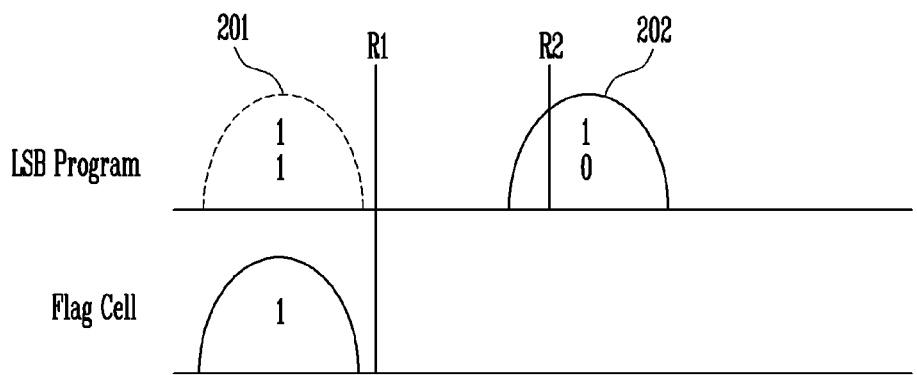
FIG. 2A is a diagram showing threshold voltage distributions after a program for the LSB page of multi-level cells is performed.
Figure 2B:
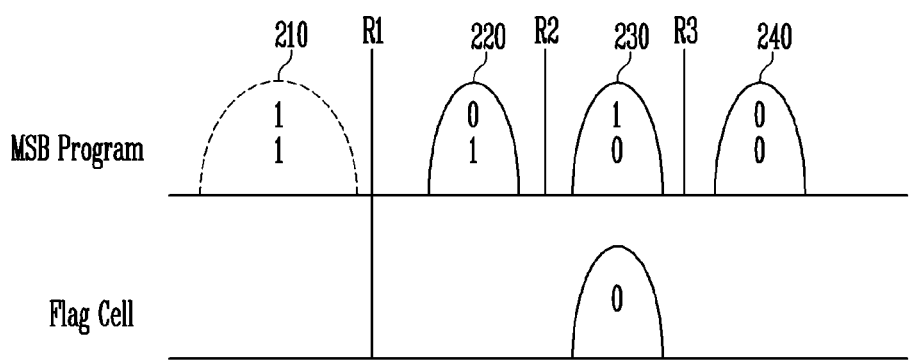
FIG. 2B is a diagram showing threshold voltage distributions after a program for the MSB page of multi-level cells is performed.

FIG. 2A is a diagram showing threshold voltage distributions after a program for the LSB page of multi-level cells is performed. FIG. 2B is a diagram showing threshold voltage distributions after a program for the MSB page of multi-level cells is performed.

Referring to FIG. 2A, when an LSB page program is performed in the semiconductor memory device 100 such as that shown in FIG. 1A, the threshold voltages of memory cells would correspond to one of a first threshold voltage distribution 201 (that is, an erase state) and a second threshold voltage distribution 202 (that is, a program state). A flag cell is maintained in the erase state. The flag cells are coupled to the respective word lines. Each of the flag cells indicates whether the memory cells of a corresponding word line have been programmed up to an LSB page or an MSB page.

That is, if the flag cell is in the erase state, it indicates that a corresponding word line has been programmed up to the LSB page. If the flag cell is in the program state, it indicates that a corresponding word line has been programmed up to the MSB page.

In a program state, as shown in FIG. 2A for example, if an MSB page program is performed, the threshold voltages of the memory cells would correspond to third to sixth threshold voltage distributions 210, 220, 230, and 240 as shown in FIG. 2B.

In this example, the flag cell is programmed so that it is included in the fifth threshold voltage distribution 230 as shown in FIG. 2B.

Referring to FIGS. 2A and 2B, when LSB data is read, a first read voltage R1 is available as a read voltage. When MSB data is read, first to third read voltages R1 to R3 are available as read voltages.

In general, when reading data in memory cells that were programmed as shown in FIGS. 2A and 2B, one word line is selected, and a data read operation using the second read voltage R2 is performed for the selected word line.

Next, data read from the flag cell is checked. If the data read from the flag cell is '0' after checking, it can be determined that the selected word line has been programmed up to the MSB page.

After performing the read operation using the second read voltage R2, if a data read operation using the first and third read voltages R1 and R3 is performed, data of the memory cells coupled to the selected word line can be normally read. In this case, both LSB and MSB are read.

However, if the data read from the flag cell is '1' as a result of the check, it means that the selected word line has been programmed up to the LSB page. Then, the data read using the second read voltage R2 is disregarded, and data is again read using the first read voltage R1.

Here, the read data is LSB data.

When data is read as described above and when in case a read operation for the MSB page is performed, the data up to LSB data is read at the same time, and so the data can be read by a minimum read operation.

Figure 3:
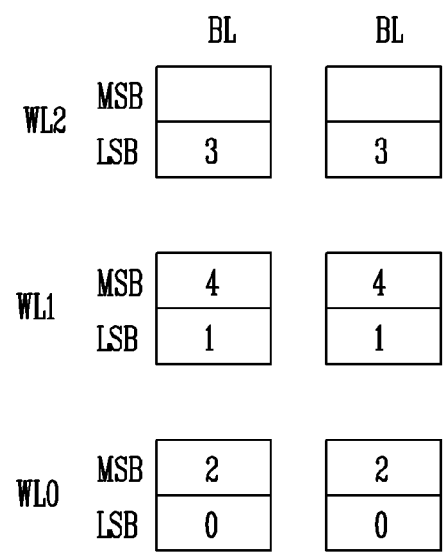
FIG. 3 is a diagram showing the sequence in which pages are selected for a program in case where one bit line and a page buffer are coupled as shown in FIG. 1C.

FIG. 3 is a diagram showing the sequence in which pages are selected for a program in case where one bit line and a page buffer are coupled as shown in FIG. 1C.

Referring to FIG. 3, in a memory block BK including the multi-level cells each capable of storing data of 2 bits, only some of the memory cells are shown in the form of blocks, and numbers are assigned according to the sequence in which pages are programmed.

In FIG. 3, a zeroth ($0^{th}$) page first selected is the LSB page of the zeroth ($0^{th}$) word line WL0.

Next, the LSB page of the first word line WL1 is selected (first page).

Next, the MSB page of the $0^{th}$ word line WL0 is selected (second page).

Prior to programming the MSB page of the first word line WL1, the LSB page of the second word line WL2 is selected (third page).

Next, the MSB page of the first word line WL1 is selected (fourth page).

One of the reasons for selecting the pages and programming according to the sequence as described above is that external input data is stored according to the above sequence. For example, zeroth ($0^{th}$) data is externally inputted and second data are stored in the memory cell, coupled to the even bit line of the $0^{th}$ word line, as an LSB and an MSB. Assuming that zeroth ($0^{th}$) data, first data, second data, . . . , $N^{th}$ data are sequentially inputted in this order externally for a program, an LSB and an MSB are not sequentially programmed in respective memory cells.

TABLE 1

| PHYSICAL PAGE | LOGICAL PAGE | PROGRAM SEQUENCE | DATA INPUT SEQUENCE |
|---|---|---|---|
| WL4 | MSB | 10 | 9 |
|     | LSB | 7  | 8 |
| WL3 | MSB | 8  | 7 |
|     | LSB | 5  | 6 |
| WL2 | MSB | 6  | 5 |
|     | LSB | 3  | 4 |
| WL1 | MSB | 4  | 3 |
|     | LSB | 1  | 2 |
| WL0 | MSB | 2  | 1 |
|     | LSB | 0  | 0 |

Referring to Table 1, logical pages corresponding to a physical page include an LSB page and an MSB page for each word line.

It can also be seen that the program sequence of data is different from the input sequence of data.

If the method of reading the LSB and the MSB at the same time is used, the read sequence of data is changed because the program sequence of data is different from the input sequence of data.

Accordingly, in an exemplary embodiment of this disclosure, when the LSB and the MSB are read at the same time in a structure such as that shown in FIG. 1C in which the page buffer is coupled to each bit line, the program sequence of data is identical to the read sequence of data. To this end, two methods may be used.

FIG. 4 is a table showing the sequence in which data is outputted when a program operation of the semiconductor memory device is performed according to a first embodiment of this disclosure.

As a first embodiment for making the program sequence of data identical with the output sequence of data, FIG. 4 shows a method of selecting pages and performing a program for the selected pages according to the sequence as shown in FIG. 3 and sequentially outputting data.

In FIG. 3, the zeroth ($0^{th}$) data and the second data are stored in the LSB and MSB pages of the zeroth ($0^{th}$) word line WL0.

Accordingly, if the zeroth ($0^{th}$) word line WL0 is selected and LSB and MSB data are read at the same time, the zeroth ($0^{th}$) data and the second data are stored in the second and third latches 125 and 126 of the page buffer 121b shown in FIG. 1C.

Among the read data, the zeroth ($0^{th}$) data stored in the second latch 125 is outputted first.

The second data stored in the third latch 126 is transferred to the fourth latch 127 and temporarily stored therein.

Next, the first word line WL1 is selected, and LSB and MSB pages are read at the same time. Accordingly, an LSB and an MSB stored in the first word line WL1 are stored in the second and third latches 125 and 126.

In FIG. 3, the first data and the fourth data are stored in the LSB and MSB pages of the first word line WL1.

Accordingly, if the first word line WL1 is read, the first data is stored in the second latch 125, and the fourth data is stored in the third latch 126.

In the semiconductor memory device 100, when the zeroth ($0^{th}$) word line WL0 is read, the zeroth ($0^{th}$) data has been outputted. Accordingly, after the zeroth ($0^{th}$) data, the first data stored in the second latch 125 is outputted.

Next, the second data temporarily stored in the fourth latch 127 is outputted. The fourth latch 127 is reset after outputting the second data.

Next, the fourth data stored in the third latch 126 is temporarily stored in the fourth latch 127.

Next, when the second word line WL2 is selected and data is read, the third data is stored in the second latch 125, and the sixth data is stored in the third latch 126.

Accordingly, the third data stored in the second latch 125 is outputted, and the fourth data temporarily stored in the fourth latch 127 is outputted.

The sixth data is temporarily stored in the fourth latch 127 again.

In case where pages are selected and a program for the selected pages are performed as shown in FIG. 2 as described above, data can be sequentially outputted.

Another method is a method of sequentially storing inputted data.

Figure 5B:
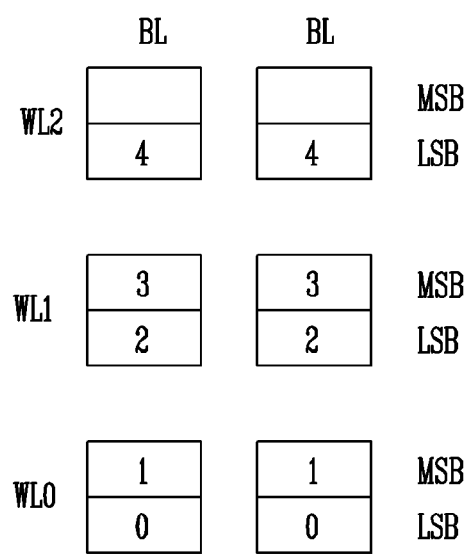
FIG. 5B is a diagram showing the sequence in which data is programmed in each page in case where a program operation is performed according to the sequence, such as that shown in FIG. 5A.

FIG. 5A is a table showing the sequence in which data is programmed when the program operation of the semiconductor memory device according to an embodiment of this disclosure is performed. FIG. 5B is a diagram showing the sequence in which data is programmed in each page in case where a program operation is performed according to the sequence, such as that shown in FIG. 5A.

Referring to FIG. 5A, zeroth ($0^{th}$) data is first inputted together with a program command.

The zeroth ($0^{th}$) data is programmed into the LSB page of the zeroth ($0^{th}$) word line WL0.

Next, when first data to be programmed is inputted, the logic group 170 does not program the first data and temporarily stores the first data in the fourth latch 127 of the page buffer 121b of FIG. 1C.

Next, when second data is inputted, the LSB page of the first word line WL1 is selected, and the second data is programmed into the LSB page. During the time for which the second data is programmed, the first data is stored in the fourth latch 127.

Next, the MSB page of the zeroth ($0^{th}$) word line WL0 is selected, and the second data temporarily stored in the fourth latch 127 is programmed into the MSB page of the $0^{th}$ word line WL0.

Consequently, the zeroth ($0^{th}$) data and the first data are sequentially programmed into the LSB page and the MSB page of the zeroth ($0^{th}$) word line WL0.

Next, when third data is inputted, the logic group 170 does not program the third data and temporarily stores the third data in the fourth latch 127.

Next, when fourth data to be programmed is inputted, the logic group 170 selects the LSB page of the second word line WL2 and programs the fourth data into the LSB page.

Here, the third data has been temporarily stored in the fourth latch 127.

After the fourth data is programmed, the logic group 170 selects the MSB page of the first word line WL1 and programs the third data, temporarily stored in the fourth latch 127, in the MSB page of the first word line WL1.

Accordingly, the second data and the third data are sequentially stored in the LSB page and the MSB page of the first word line WL1.

The sequence in which the data has been programmed according to the above operation is shown in FIG. 5B.

As shown in FIG. 5B, the sequence in which the data is stored in the LSB page and the MSB page of one word line is sequential. Accordingly, when the data is subsequently read, the sequence in which the data is outputted is not changed although the LSB page and the MSB page are read at the same time.

Even in case where the LSB and MSB pages are read at the same time according to exemplary embodiments of the present invention, external devices coupled to the semiconductor memory device 100 can be provided with data read according to the same sequence as that data is inputted for a program.

As described above, in the method of operating the semiconductor memory device according to an embodiment of this disclosure, in the structure in which the page buffer is coupled to each bit line, the LSB page and the MSB page can be read at the same time by changing the sequence in which page addresses are selected and the sequence in which data is read. Accordingly, the read time can be reduced, and data can be read sequentially.

What is claimed is:

1. A method of operating a semiconductor memory device, comprising:
   inputting a first program command and first data to be programmed;
   selecting an LSB page of a first word line, programming the first data into the LSB page, and verifying the program for the LSB page;
   inputting a second program command and second data to be programmed;
   storing the second data in a temporary latch of a page buffer;
   inputting a third program command and third data to be programmed;
   programming the third data into an LSB page of a second word line and verifying the program for the LSB page of the second word line; and
   programming the second data of the latch into an MSB page of the first word line and verifying the program for the MSB page.

2. The method of claim 1, wherein, when the data stored in the first or second word line is read, the first or second word line is selected, the data stored in the LSB page and the MSB page of the selected first or second word line is read, and the read data is sequentially outputted.

3. The method of claim 2, wherein the data stored in the first or second word line is read by reading data stored in memory cells and a flag cell coupled to the first or second word line by supplying a second read voltage to the first or second word line and reading data stored in the memory cells coupled to the first or second word line by supplying first and third read voltages to the first or second word line according to a state of the data stored in the flag cell.

4. The method of claim 3, wherein in case where the data of the flag cell is in an erase state, the data of the memory cells coupled to the first or second word line is read by using the first read voltage, the read data is outputted as the data of the LSB page of the first or second word line, and the data of the MSB page of the first or second word line is outputted as a first logic level.

5. The method of claim 4, wherein, when the data of the flag cell is in a program state, the data read using the second read voltage is outputted as the data of the LSB page stored in the memory cells coupled to the first or second word line, final data, including the data read using the second read voltage and the data consecutive to the read data and read using the first and third read voltages, is outputted as the data of the MSB page stored in the memory cells coupled to the first or second word line.

6. The method of claim 1, further comprising:
   inputting a fourth program command and fourth data to be programmed;
   storing the fourth data in the temporary latch of the page buffer;

inputting a fifth program command and fifth data to be programmed;

programming the fifth data into an LSB page of a third word line and verifying the program for the LSB page of the third word line; and programming the fourth data of the latch into an MSB page of the third word line and verifying the program for the MSB page of the third word line.

* * * * *